United States Patent
Lee et al.

(10) Patent No.: US 8,131,233 B2
(45) Date of Patent: Mar. 6, 2012

(54) TIME ALIGNMENT METHODS AND APPARATUS FOR POLAR MODULATION TRANSMITTERS

(75) Inventors: Wayne S. Lee, San Mateo, CA (US); Tony L. Wong, Hayward, CA (US)

(73) Assignee: Panasonic Corporation, Osaka (JP)

( * ) Notice: Subject to any disclaimer, the term of this patent is extended or adjusted under 35 U.S.C. 154(b) by 763 days.

(21) Appl. No.: 12/242,255

(22) Filed: Sep. 30, 2008

(65) Prior Publication Data

US 2010/0081397 A1 Apr. 1, 2010

(51) Int. Cl.
*H04B 1/04* (2006.01)
(52) U.S. Cl. .............. 455/114.3; 455/127.5; 375/296
(58) Field of Classification Search ...... 455/11.4–114.3, 455/127.1–127.5, 102, 108, 110; 375/296, 375/297
See application file for complete search history.

(56) References Cited

U.S. PATENT DOCUMENTS

| | | | |
|---|---|---|---|
| 7,054,385 B2 | 5/2006 | Booth et al. | |
| 7,379,715 B2 * | 5/2008 | Udagawa et al. | 455/126 |
| 2006/0071711 A1 * | 4/2006 | Persson et al. | 330/149 |

\* cited by examiner

*Primary Examiner* — Nhan Le

(57) ABSTRACT

A polar modulation transmitter includes an amplitude modulation (AM) path with an amplitude modulation to amplitude modulation (AM/AM') correction circuit and a phase modulation (PM) path with a delay element and an amplitude modulation to phase modulation (AM'/PM) correction circuit. The AM/AM' correction circuit receives and predistorts a digital amplitude component signal depending on amplitudes of samples in the digital amplitude component signal, thereby generating a predistorted digital amplitude component signal. The delay element receives and delays a digital phase component signal, to generate a delayed digital phase component signal having a delay corresponding to the latency introduced by the AM/AM' correction circuit. The AM'/PM correction circuit predistorts the delayed digital phase component signal depending on amplitudes of samples in the predistorted amplitude component signal, thereby generating a predistorted digital phase component signal.

7 Claims, 6 Drawing Sheets

TIME ALIGNMENT METHODS AND APPARATUS FOR POLAR MODULATION TRANSMITTERS

FIELD OF THE INVENTION

The present invention relates to communications transmitters. More specifically, the present invention relates to methods and apparatus for methods and apparatus for aligning signals in polar modulation transmitters.

BACKGROUND OF THE INVENTION

Regulatory bodies and wireless standards organizations require radio frequency (RF) transmitters to transmit in certain predefined frequency bands. To increase the amount of information that can be transmitted in any given frequency band (i.e., to increase what is referred to as "spectral efficiency"), many existing and soon-to-be deployed wireless communication technologies, such as Wideband Code Division Multiple Access (W-CDMA), High-Speed Packet Access (HSPA) and Long Term Evolution (LTE) cellular technologies, employ nonconstant-envelope signals.

In conventional quadrature-modulator-based transmitters, nonconstant-envelope signals must first be reduced before they are applied to the input of the transmitter's PA, and the PA must be biased in its linear region, in order to prevent signal peak clipping. However, when the PA is backed off in this manner, it is very inefficient at converting direct current (DC) power from the transmitter's power supply to radio frequency (RF) energy, and linearity is achieved at the expense of power efficiency.

Fortunately, the efficiency versus linearity trade-off of conventional quadrature-modulator-based transmitters can be avoided by using a polar modulation transmitter, instead. In a polar modulation transmitter, the amplitude information (i.e., the signal envelope) is temporarily removed from the nonconstant-envelope signal. With the signal envelope temporarily removed, the polar modulation transmitter's PA is allowed to operate in its nonlinear region, where it is more efficient at converting power from the transmitter's power supply into RF power than when configured to operate in its linear region. As explained in more detail below, the signal envelope is restored at the output of the PA by dynamically controlling the PA's power supply according to amplitude variations in the signal envelope.

FIG. 1 is a simplified drawing of a typical polar modulation transmitter 100. The polar modulation transmitter 100 includes a digital signal processor (DSP) 102; a Coordinate Rotation Digital Computer (CORDIC) converter 104; an amplitude modulation (AM) path including a first digital-to-analog converter (DAC) 106 and an amplitude modulator 108; a phase modulation (PM) path including a second DAC 110 and a phase modulator 112; a PA 114; and an antenna 116.

The DSP 102 operates to generate rectangular-coordinate in-phase and quadrature phase (i.e., I and Q) signals from bits in an incoming digital message to be transmitted. The I and Q signals are formatted in accordance with a predetermined modulation format, pulse-shaped to reduce signal bandwidth, and then coupled to inputs of the CORDIC converter 104. The CORDIC converter 104 converts the pulse-shaped I and Q signals into a digital amplitude component signal $\rho$ representing the signal envelope and a digital phase component signal $\theta$ representing phase modulation.

The first and second DACs 106 and 110 convert the digital amplitude and phase component signals $\rho$ and $\theta$ into analog amplitude and phase modulation signals, which are coupled to inputs of the amplitude modulator 108 and the phase modulator 112, respectively. The amplitude modulator 108 operates to modulate a DC power supply Vsupply according to amplitude variations in the analog amplitude modulation signal, to generate an amplitude-modulated power supply signal Vs(t), which is coupled to the power supply port of the PA 114. Meanwhile, the phase modulator 112 operates to modulate an RF carrier signal according to phase variations in the analog phase modulation signal, to generate a phase-modulated RF carrier signal RFin, which is coupled to the RF input port of the PA 114.

Because the phase-modulated RF carrier signal RFin has a constant envelope, the PA 114 can be configured to operate in its nonlinear region of operation. Typically, the PA 114 is implemented as a Class D, E or F switch-mode PA 114 operating between compressed and cut-off states (i.e., in a "compressed mode"), so that the output power of the PA 114 is directly controlled and modulated according to amplitude variations in the amplitude-modulated power supply signal Vs(t). By modulating the power supply port of the PA 114 in this manner, the amplitude modulation represented in the original digital amplitude component signal $\rho$ is restored at the output of the PA 114, as the PA 114 amplifies the phase-modulated RF carrier signal RFin.

Operating the PA 114 in its nonlinear region, where it is most efficient, is highly desirable, particularly in battery-powered applications where power efficiency is an overriding concern. However, because it is operated in its nonlinear region, the PA 114 distorts the signals it amplifies. One type of distortion, known as amplitude modulation to amplitude modulation (AM/AM) distortion, results from the fact that the gain of the PA 114 compresses for higher values of the input control voltage, i.e., for higher amplitudes of the amplitude-modulated power supply signal Vs(t).

Another type of distortion known as amplitude modulation to phase modulation (AM/PM) distortion results from an undesirable phase modulation of the PA output signal RFout by an out-of-phase signal leaked from the RF input of the PA 114 to the RF output of the PA 114. The degree of AM/PM distortion introduced into the output signal depends on the amplitude of the amplitude-modulated power supply signal Vs(t) relative to the amplitude of the leaked signal. Generally, the larger the amplitude of the leaked signal is relative to the amplitude of the amplitude-modulated power supply signal Vs(t), the larger the amount of AM/PM distortion.

Various approaches that compensate for AM/AM and AM/PM distortion, i.e., approaches that "linearize" the output of the PA 114, have been proposed. One approach is to predistort the signals applied to the RF input port and power supply port of the PA 114, according to inverse responses of predetermined AM/AM and AM/PM responses of the PA 114. In this manner, when the phase-modulated RF carrier signal RFin is amplified by the PA 114, the "corrected" PA response more accurately tracks an ideal PA response compared to if no predistortion had been applied. This approach of compensating for AM/AM and AM/PM distortion is shown in FIGS. 2A and 2B.

Predistortion techniques can be effective at linearizing the output of the PA 114 of the polar modulation transmitter 100, and, as a consequence, allow the PA 114 to be operated efficiently in its nonlinear region in spite of the nonlinear characteristics of the PA 114. However, if the predistortion is not performed properly, out-of-band signal energy is generated, making it difficult to comply with out-of-band noise limitation standards.

Wireless communications standards often impose strict limits on the amount of out-of-band signal energy a transmitter is allowed to generate. Compliance with any given standard depends on how the standard is specified and on the particular type of technology involved. For example, in transmitters configured to operate according to the W-CDMA air interface in a Universal Mobile Telecommunications System (UMTS), compliance is determined by comparing the power spectral density (PSD) 308 of the output of the transmitter's PA to a spectral mask 302 defining the maximum allowable transmit power in adjacent channels, as illustrated in FIG. 3. Numerically, compliance is measured in terms of what is known as the adjacent channel leakage ratio (ACLR)—defined as the ratio of the integrated signal power in an adjacent channel (e.g., adjacent channels 306a or 306b in FIG. 3) to the integrated signal power in the desired or designated channel (e.g., desired or designated channel 304 in FIG. 3). Maximum ACLRs are specified for both uplink (mobile to base-station) and downlink (base-station to mobile) transmission. For example, compliance with the uplink ACLR specification requires that the signal power in the first adjacent channel (306a or 306b in FIG. 3) be at least −33 dB down from the average output power at the center frequency $f_c$ of the desired or designated channel 304.

Controlling out-of-band signal energy can be difficult in the design of any type of transmitter. It can be particularly difficult in the design of the polar modulation transmitter 100. One difficulty relates to the fact that the digital amplitude and phase component signals $\rho$ and $\theta$ are processed separately in independent AM and PM paths. The level of processing performed on the digital amplitude component signal $\rho$ in the AM path is usually different from the level of processing performed on the digital phase component signal $\theta$ in the PM path. The different levels of processing can detrimentally affect the accuracy of the AM/AM and AM/PM correction processes, result in an increase in out-of-band signal energy, and, therefore, make it difficult, or in some cases even impossible, to comply with out-of-band noise limitation standards.

It would be desirable, therefore, to have polar modulation transmitters and methods of operating polar modulation transmitters, which are capable of processing nonconstant-envelope modulation signals, and which provide accurate AM/AM and AM/PM correction, even in the presence of different levels of processing in the AM and PM paths of the polar modulation transmitters.

SUMMARY OF THE INVENTION

Methods and apparatus for predistorting and aligning signals in polar modulation transmitters are disclosed. An exemplary polar modulation transmitter includes an amplitude modulation (AM) path including an amplitude modulation to amplitude modulation (AM/AM') correction circuit and a phase modulation (PM) path including a first delay element and an amplitude modulation to phase modulation (AM'/PM) correction circuit. In one embodiment of the invention, the AM/AM' correction circuit is implemented as an AM/AM' look up table (LUT) configured to store AM'/AM predistortion coefficients, and the AM'/PM correction circuit is implemented as an AM'/PM LUT configured to store phase correction deltas.

The AM/AM' correction circuit receives and predistorts a digital amplitude component signal $\rho$ depending on amplitudes of samples in the digital amplitude component signal, thereby generating a predistorted digital amplitude component signal $\rho'$. The first delay element receives and delays a digital phase component signal $\theta$, to generate a delayed digital phase component signal having a delay corresponding to the latency introduced by the AM/AM' correction circuit. The AM'/PM correction circuit predistorts the delayed digital phase component signal depending on amplitudes of samples in the predistorted amplitude component signal $\rho'$, thereby generating a predistorted digital phase component signal $\theta'$.

In one embodiment, the polar modulation transmitter further includes a bandwidth reduction circuit for reducing the bandwidths of either or both of the digital amplitude modulation and digital phase modulation signals. To account for timing discrepancies produced by different levels of processing performed by the bandwidth reduction circuit, a second delay element is provided to ensure that the bandwidth-reduced digital amplitude component and digital phase component signals in the AM and PM paths are synchronized at the outputs of the bandwidth reduction circuit.

Further features and advantages of the present invention, including a description of the structure and operation of the above-summarized and other exemplary embodiments of the invention, are described in detail below with respect to accompanying drawings, in which like reference numbers are used to indicate identical or functionally similar elements.

DETAILED DESCRIPTION

Figure 1:
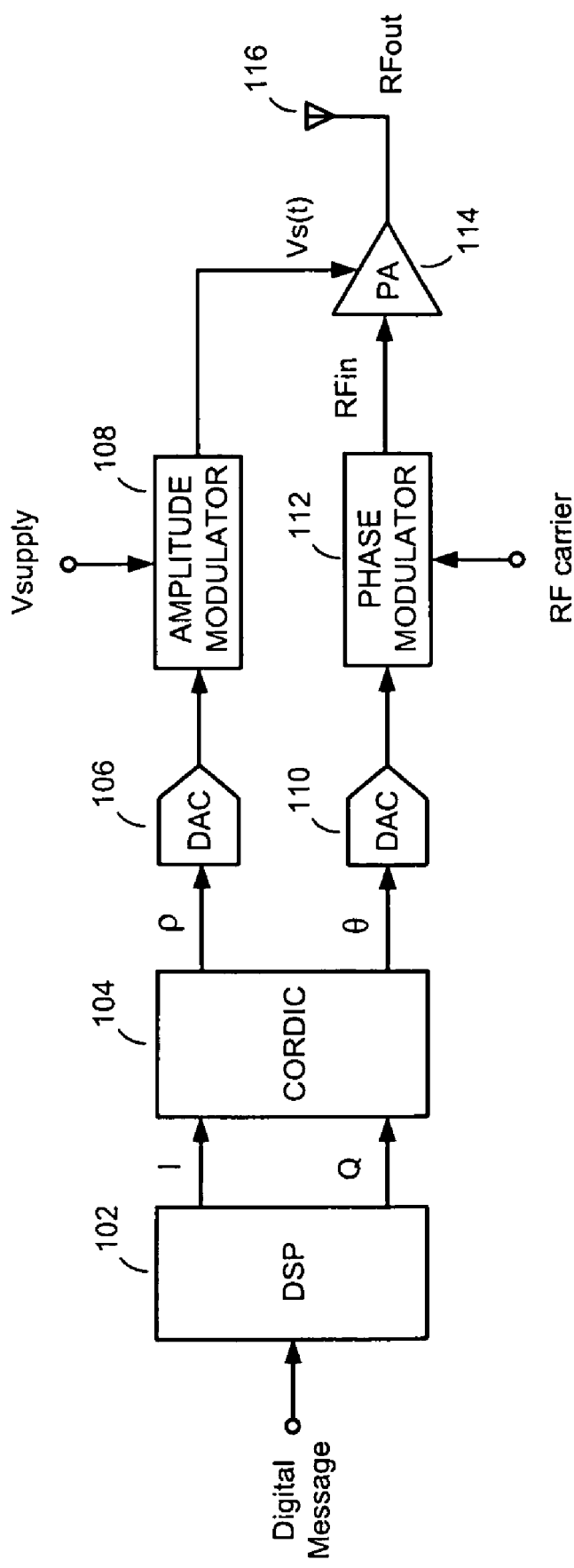
FIG. 1 is a simplified drawing of a conventional polar modulation transmitter.
Figure 2A:
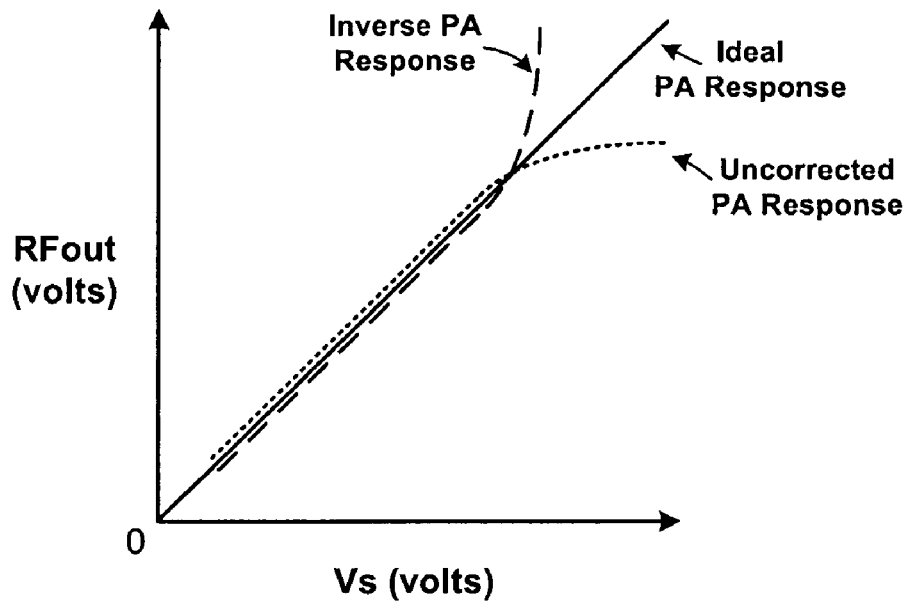
FIG. 2A is a graph illustrating how amplitude modulation to amplitude modulation (AM/AM) distortion in an uncorrected power amplifier (PA) response can be corrected (i.e., "predistorted") by predistorting the uncorrected PA response by an inverse PA response.
Figure 2B:
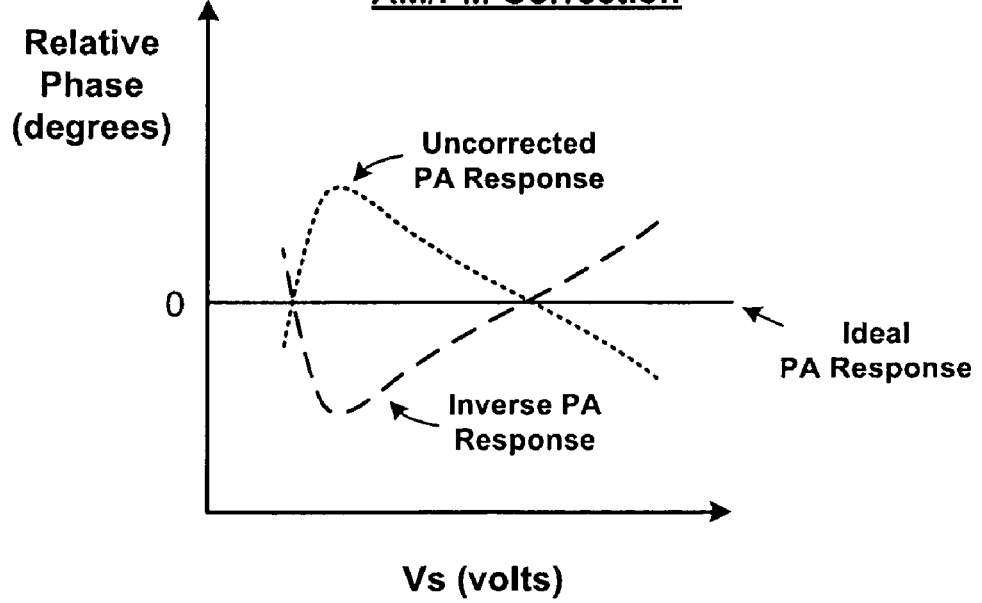
FIG. 2B is a graph illustrating how amplitude modulation to phase modulation (AM/PM) distortion in an uncorrected power amplifier (PA) response is corrected by predistorting the uncorrected PA response by an inverse PA response.
Figure 3:
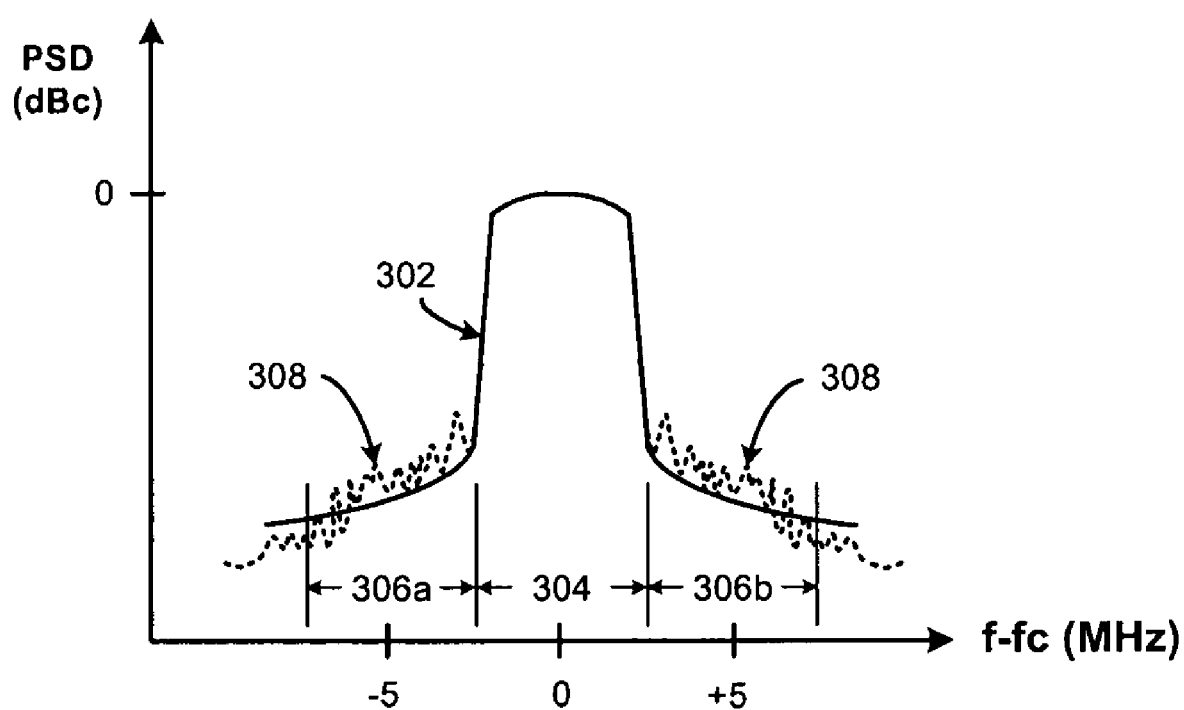
FIG. 3 is a simplified power spectral density (PSD) diagram illustrating how out-of-band noise in channels adjacent to a desired or designated channel can make it difficult to comply with out-of-band noise limitation standards.
Figure 4:
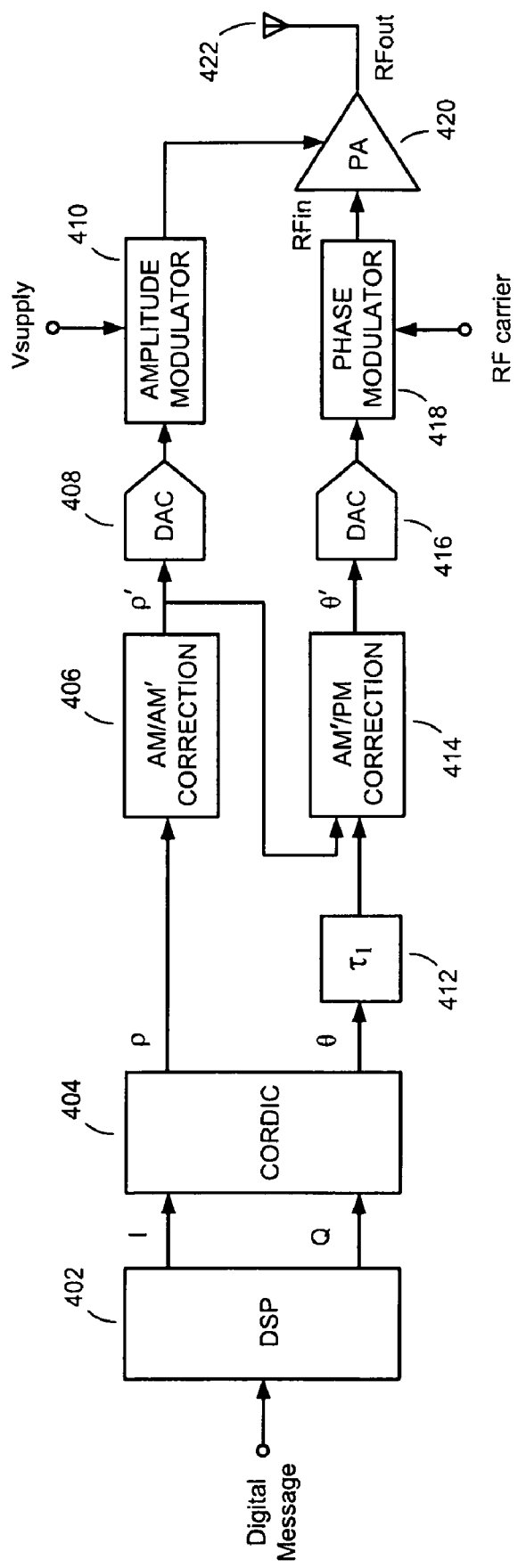
FIG. 4 is a polar modulation transmitter, according to an embodiment of the present invention.

Referring to FIG. 4, there is shown a polar modulation transmitter 400, according to an embodiment of the present invention. The polar modulation transmitter 400 comprises a digital signal processor (DSP) 402, a Coordinate Rotation Digital Computer (CORDIC) converter 404; an amplitude modulation (AM) path including an amplitude modulation to amplitude modulation (AM/AM') correction circuit 406, a first digital-to-analog converter (DAC) 408 and an amplitude modulator 410; a phase modulation (PM) path including a first delay element 412, an amplitude modulation to phase modulation (AM'/PM) correction circuit 414, a second DAC 416 and a phase modulator 418; a power amplifier (PA) 420; and an antenna 422.

The DSP 402 operates to generate rectangular-coordinate in-phase and quadrature phase (i.e., I and Q) signals from bits in an incoming digital message to be transmitted. The I and Q signals are formatted in accordance with a predetermined modulation format, pulse-shaped to reduce signal bandwidth, and then coupled to inputs of the CORDIC converter 404. The CORDIC converter 404 converts the pulse-shaped I and Q signals into a digital amplitude component signal ρ representing the signal envelope and a digital phase component signal θ representing the phase modulation.

The digital amplitude component signal ρ is coupled to the input of the AM/AM' correction circuit 406, which in one embodiment comprises an AM/AM' look up table (LUT). The AM/AM' LUT is configured to store digital AM/AM' predistortion coefficients, and is indexed according to the amplitudes of the samples in the digital amplitude component signal ρ. During operation, AM/AM' predistortion coefficients are indexed and retrieved from the AM/AM' LUT according to the amplitudes of the samples of the digital amplitude component signal ρ. For each successive sample, the retrieved predistortion coefficients are used to predistort the samples in the digital amplitude component signal ρ, thereby producing a predistorted digital amplitude component signal θ'.

The predistorted digital amplitude component signal ρ' is coupled to the input of the AM'/PM correction circuit 414, which in one embodiment comprises an AM'/PM LUT. The AM'/PM LUT is configured to store AM'/PM phase correction deltas. During operation, the AM'/PM LUT is indexed according to the amplitudes of the samples of the predistorted digital amplitude component signal ρ', and for each sample an AM'/PM phase correction delta is retrieved from the AM'/PM LUT. Retrieved phase correction deltas are added to the phases represented in matching samples of the delayed version of the digital phase component signal θ, thereby producing a predistorted digital phase component signal θ'.

According to one aspect of the invention, the digital phase component signal θ is delayed before it is predistorted by the AM'/PM correction process. The delay, which is introduced by the first delay element 412, accounts for the latency introduced by the AM/AM' correction circuit 406 in the AM path. In other words, the delay is made to be substantially equal to the latency introduced by the AM/AM' correction circuit 406. This ensures accurate indexing of the AM'/PM LUT, and accurate predistortion of matching samples in the AM and PM paths. As will be appreciated by those of ordinary skill in the art, the first delay element 412 can be implemented in a variety of different ways, including as a delay line comprised of a series of delay buffers or shift registers, a digital filter, or a digital signal processor.

Following the AM/AM' correction process, the first DAC 408 converts the predistorted digital amplitude component signal ρ' into a predistorted analog amplitude modulation signal. The amplitude modulator 410 operates to modulate a direct current (DC) power supply Vsupply according to amplitude variations in the predistorted analog amplitude modulation signal, to produce a predistorted amplitude-modulated power supply signal Vs(t), which is coupled to the power supply port of the PA 420. Similarly, following the AM'/PM correction process, the second DAC 416 converts the predistorted digital phase component signal θ' into a predistorted analog phase modulation signal. The phase modulator 418 receives the predistorted analog phase modulation signal and modulates an RF carrier signal, to produce a predistorted phase-modulated RF carrier signal RFin, which is coupled to the RF input port of the PA 420.

The PA 420 is configured to operate in its nonlinear region of operation, where it is efficient at converting power from the DC power supply Vsupply into RF power. In one embodiment, the PA 420 comprises a Class D, E or F switch-mode PA 420 operating between compressed and cut-off states, so that the output power of the PA 420 is directly controlled and modulated according to amplitude variations in the predistorted amplitude-modulated power supply signal Vs(t). By modulating the power supply port of the PA 420 in this manner, the amplitude modulation represented in the original digital amplitude component signal ρ is restored at the output RFout of the PA 420, as the PA 420 amplifies the predistorted phase-modulated RF carrier signal RFin.

Figure 5:
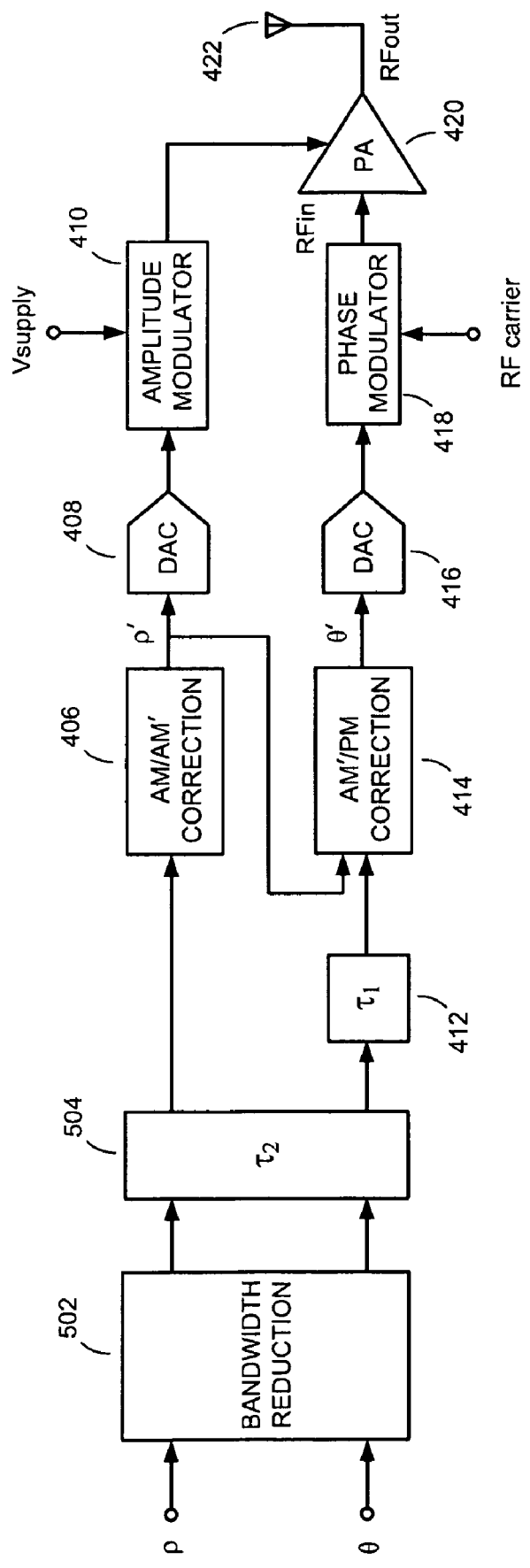
FIG. 5 is a polar modulation transmitter, according to an embodiment of the present invention.

FIG. 5 is a drawing of a polar modulation transmitter 500, according to another embodiment of the invention. The polar modulation transmitter 500 is similar to the polar modulation transmitter 400 in FIG. 4, except that it further includes a bandwidth reduction circuit 502 and a second delay element 504. (Note that for ease in illustration the DSP 402 and CORDIC converter 404 have been omitted from the drawing in FIG. 5.) The bandwidth reduction circuit 502 is employed to reduce the bandwidth(s) of the digital amplitude component and/or phase component signals ρ and θ. While the bandwidth reduction circuit 502 is shown as operating following conversion of the rectangular-coordinate I and Q signals to polar coordinates, the bandwidth reduction may be alternatively (or additionally) performed prior to the I and Q signals being converted to polar coordinates.

Either linear or nonlinear filtering techniques may be used to implement the bandwidth reduction circuit 502. In one embodiment, a nonlinear filter is used and is configured to reduce the bandwidth of the amplitude component signal ρ and/or the bandwidth of the phase component signal θ. In performing the bandwidth reduction process(es), the bandwidth reduction circuit 502 is configured to reduce the peak-to-average (PAR) ratio and/or the average-to-minimum ratio (AMR) of the digital amplitude component signal ρ. Some exemplary nonlinear filtering techniques which may be used to implement the bandwidth reduction circuit 502 are described in U.S. Pat. No. 7,054,385 to Booth et al. and U.S. patent application Ser. No. 12/172,786 to Schell et al., both of which are incorporated into this disclosure by reference.

The second delay element 504 is used to delay the digital amplitude component signal ρ relative to the digital phase component signal θ, or vice versa, to compensate for the time difference that may arise due to one of the two signals requiring a higher level of processing compared to the other. In other words, the second delay element 504 is used to synchronize the digital amplitude and phase component signals ρ and θ before the digital amplitude component signal ρ is predistorted by the AM/AM' correction circuit 406 and before the digital phase component signal θ is delayed by the first delay element 412. Like the first delay element 412, the second delay element 504 can be implemented using a delay line comprised of a series of delay buffers or shift registers, a digital filter, a digital signal processor, or any other suitable type of digital delay element. Note that the second delay element 504 is shown to be incorporated into both the AM and PM paths of the polar modulation transmitter 500. This is done to emphasize that the delay element may be configured in either of the AM and PM paths or distributed in both the AM and PM paths.

Following the bandwidth reduction process and the delay introduced by the second delay element 504, the first delay element 412 presents an additional delay in the PM path, to account for the latency introduced by the AM/AM' correction circuit 406 in the AM path, similar to as in the polar modulation transmitter 400 in FIG. 4.

Figure 6:
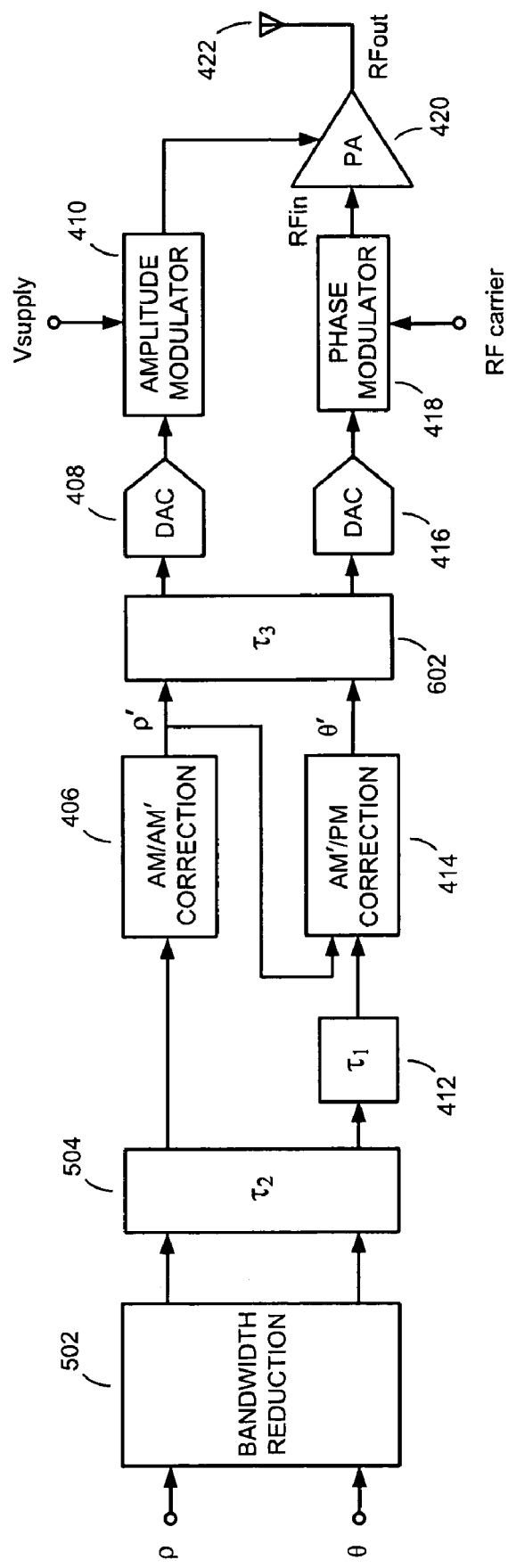
FIG. 6 is a polar modulation transmitter, according to an embodiment of the present invention.

FIG. 6 is a drawing of a polar modulation transmitter 600, according to another embodiment of the invention. This embodiment of the invention is similar to the polar modulation transmitter 500 in FIG. 5, except that it further includes a third delay element 602 in the AM and PM paths following the AM/AM' and AM'/PM correction circuits 406 and 414. The third delay element 602 is used to compensate for the differences in latencies presented by the amplitude modulator 410 in the AM path and the phase modulator 418 in the PM path, to ensure that the predistorted amplitude-modulated power supply signal Vs(t) and the predistorted phase-modulated RF carrier signal RFin arrive at the power supply and RF input ports of the PA 420 in proper timed alignment. Whereas the third delay element 602 is shown as comprising a digital delay element, in an alternative embodiment the third delay element is implemented as an analog delay element and configured in one of the AM and PM paths following one of the first and second DACs 408 and 416.

Although the present invention has been described with reference to specific embodiments, these embodiments are merely illustrative and not restrictive of the present invention. Further, various modifications or changes to the specifically disclosed exemplary embodiments will be suggested to persons skilled in the art and are to be included within the spirit and purview of this application and scope of the appended claims.

What is claimed is:

1. A polar modulation transmitter, comprising:
an amplitude modulation (AM) path including an amplitude modulation correction circuit configured to receive and predistort a digital amplitude component signal depending on amplitudes of samples in the digital amplitude component signal, to generate a predistorted digital amplitude component signal;
a phase modulation (PM) path including a first delay element and a phase modulation correction circuit, said first delay element configured to receive and delay a digital phase component signal, to generate a delayed digital phase component signal having a delay corresponding to a latency introduced by said amplitude modulation correction circuit, and said phase modulation correction circuit configured to predistort the delayed digital phase component signal depending on amplitudes of samples in the predistorted amplitude component signal, to generate a predistorted digital phase component signal;
first and second digital-to-analog converters (DACs) configured in said AM and PM paths, respectively, said first DAC configured to convert the predistorted digital amplitude component signal into a predistorted analog amplitude modulation signal, and said second DAC configured to convert the predistorted digital phase component signal into a predistorted analog phase modulation signal;
an amplitude modulator configured to modulate a direct current (DC) power supply according to amplitude variations in said predistorted analog amplitude modulation signal, to produce a predistorted amplitude-modulated power supply signal;
a phase modulator configured to modulate a radio frequency (RF) carrier signal according to phase variations in said predistorted analog phase modulation signal, to produce a predistorted phase-modulated RF carrier signal;
an RF power amplifier (PA) having a power supply port configured to receive the predistorted amplitude-modulated power supply signal from said amplitude modulator, an RF input port configured to receive the predistorted phase-modulated RF carrier signal from said phase modulator, and an RF output port; and
another delay element configured in either of said AM and PM paths operable to provide a delay that ensures that the predistorted amplitude-modulated power supply signal and the predistorted phase-modulated RF carrier signal arrive at the power supply and RF input ports of the PA in proper timed alignment.

2. The polar modulation transmitter of claim 1 wherein said amplitude modulation correction circuit comprises an AM/AM' look up table (LUT) configured to store predistortion coefficients that are indexable according to amplitudes of the samples in the digital amplitude component signal, and said phase modulation correction circuit comprises an AM'/PM LUT containing phase correction deltas that are indexable according to amplitudes of the samples in the predistorted digital amplitude component signal.

3. A polar modulation transmitter, comprising:
means for predistorting a digital amplitude component signal in an amplitude modulation (AM) path, to produce a predistorted digital amplitude component signal;
means for predistorting a digital phase component signal in a phase modulation (PM) path depending on amplitudes represented in the predistorted digital amplitude component signal, to produce a predistorted digital phase component signal;
means for compensating for a latency of said means for predistorting a digital amplitude component signal, said means for compensating configured to compensate for said latency before said digital phase component signal is predistorted by said means for predistorting a digital phase component signal;
means for generating a predistorted amplitude-modulated power supply signal based on amplitude variations represented in said predistorted digital amplitude component signal;
means for generating a predistorted phase-modulated radio frequency (RF) carrier signal based on phase variations represented in said predistorted digital phase component signal;
an RF power amplifier (PA) having a power supply port configured to receive the predistorted amplitude-modulated power supply signal, an RF input port configured to receive the predistorted phase-modulated RF carrier signal, and an RF output port; and
means for time aligning the predistorted amplitude-modulated power supply signal and the predistorted phase-modulated RF carrier signal at the power supply and RF input ports of the PA.

4. A method of linearizing the output of a polar modulation transmitter, comprising:
predistorting a digital amplitude component signal in an amplitude modulation (AM) path according to an amplitude modulation correction process, to produce a predistorted digital amplitude component signal;
delaying a digital phase component signal in a phase modulation (PM) path for a time corresponding to a latency of said amplitude modulation correction process, to produce a delayed digital phase component signal;
predistorting the delayed digital phase component signal according to phase modulation correction process, to produce a predistorted digital phase component signal;
generating a predistorted amplitude-modulated power supply signal based on amplitude variations represented in said predistorted digital amplitude component signal;
generating a predistorted phase-modulated radio frequency (RF) carrier signal based on phase variations represented in said predistorted digital phase component signal;
coupling the predistorted phase-modulated RF carrier signal to an RF input of a power amplifier (PA);

coupling the predistorted amplitude-modulated power supply signal to a power supply port of the PA; and reducing a time delay between the predistorted digital amplitude component signal and the predistorted phase-modulated RF carrier signal at the power supply and RF input ports of the PA.

5. The method of claim 4, further comprising synchronizing the digital amplitude component signal with the digital phase component signal before the digital amplitude component signal is predistorted.

6. The method of claim 4 wherein said amplitude modulation correction process comprises:

retrieving predistortion coefficients from an AM/AM' look up table (LUT) based on amplitudes represented in said digital amplitude component signal; and predistorting said digital amplitude component signal using the retrieved predistortion coefficients.

7. The method of claim 6 wherein said phase modulation corrections process comprises:

retrieving phase correction deltas from an AM'/PM LUT based on amplitudes represented in said predistorted digital amplitude component signal; and predistorting said delayed digital phase component signal using the retrieved phase correction deltas.

* * * * *